(12) United States Patent
Kanter

(10) Patent No.: US 8,766,161 B2
(45) Date of Patent: Jul. 1, 2014

(54) SYSTEM FOR CONTROLING AND CALIBRATING SINGLE PHOTON DETECTION DEVICES

(75) Inventor: Gregory S. Kanter, Chicago, IL (US)

(73) Assignee: Nucript LLC, Evanston, IL (US)

( * ) Notice: Subject to any disclaimer, the term of this patent is extended or adjusted under 35 U.S.C. 154(b) by 687 days.

(21) Appl. No.: 12/957,552

(22) Filed: Dec. 1, 2010

(65) Prior Publication Data

US 2011/0127415 A1   Jun. 2, 2011

(51) Int. Cl.
*G01D 18/00* (2006.01)
*G01J 1/44* (2006.01)
*H03K 17/78* (2006.01)

(52) U.S. Cl.
CPC . *G01D 18/00* (2013.01); *G01J 1/44* (2013.01); *H03K 17/78* (2013.01)
USPC ............. 250/208.2; 250/214 R; 250/214 DC; 250/252.1; 250/394

(58) Field of Classification Search
CPC ............ G01J 1/44; G01D 18/00; H03K 17/78
USPC .......... 250/214 R, 214 DC, 208.2, 394, 252.1
See application file for complete search history.

(56) References Cited

U.S. PATENT DOCUMENTS

| | | | |
|---|---|---|---|
| 5,987,483 A * | 11/1999 | Edelkind et al. ............... | 708/250 |
| 7,157,681 B1 * | 1/2007 | Tetzlaff ......................... | 250/207 |
| 7,197,523 B2 * | 3/2007 | Lutkenhaus et al. .......... | 708/255 |
| 7,417,472 B2 * | 8/2008 | Tumer et al. ................... | 327/70 |
| 7,663,120 B2 * | 2/2010 | Tomita et al. ................. | 250/394 |
| 7,868,665 B2 * | 1/2011 | Tumer et al. ................... | 327/70 |
| 8,072,595 B1 * | 12/2011 | Bastiaans et al. ............. | 356/301 |
| 8,269,964 B2 * | 9/2012 | Heanue et al. ................ | 356/317 |
| 2004/0139132 A1 * | 7/2004 | Lutkenhaus et al. .......... | 708/250 |
| 2008/0290259 A1 * | 11/2008 | Mathewson et al. ...... | 250/214 R |
| 2009/0140159 A1 * | 6/2009 | Tomita et al. ................. | 250/394 |
| 2009/0236501 A1 * | 9/2009 | Takahashi et al. ........ | 250/214 R |
| 2009/0272882 A1 * | 11/2009 | Rabner ...................... | 250/214 A |
| 2011/0127415 A1 * | 6/2011 | Kanter ....................... | 250/252.1 |
| 2011/0315856 A1 * | 12/2011 | O'Mathuna et al. ....... | 250/208.2 |

* cited by examiner

*Primary Examiner* — John Lee
(74) *Attorney, Agent, or Firm* — Nadya Reingand

(57) ABSTRACT

A single photon detection system and method are disclosed which have a control block for helping to monitor and optimize performance, especially at high detection rates. The system is based on photon detectors constructed with avalanche photodiodes (APD) gated in time to operate in the Geiger mode. An electrical reference frequency is generated which is subtracted from the APD output in order to better isolate the breakdown event. The resulting signal is sampled and analyzed to allow the control unit to optimize the magnitude and phase of the electrical reference frequency. The control unit may also change the gate pulse shape and phase, including by the use of a digital-to-analog converter. The gate pulse can be shifted off an input optical pulse so as to estimate dark count rate, or shifted to measure a reference input signal to estimate detection efficiency.

21 Claims, 6 Drawing Sheets

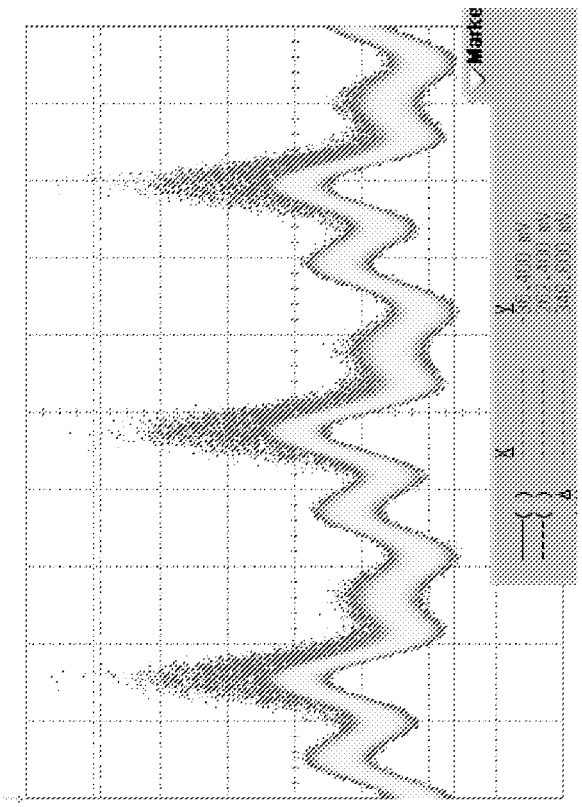
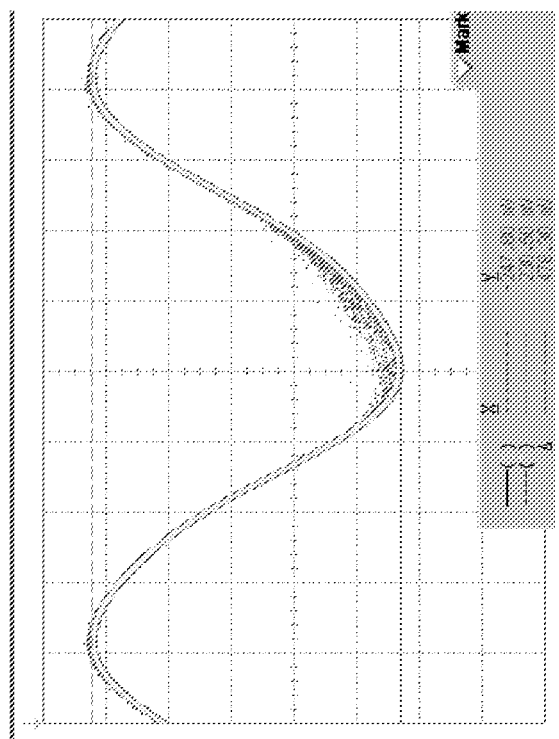
Fig. 2

SYSTEM FOR CONTROLING AND CALIBRATING SINGLE PHOTON DETECTION DEVICES

STATEMENT REGARDING FEDERALLY SPONSORED RESEARCH OR DEVELOPMENT

The United States Government has certain rights to this invention pursuant to contract No. W31P4Q-09-C-0115 from the Defense Advanced Research Projects Agency (DARPA) and contract No. FA9550-10-C-0079 from the Air Force Office of Scientific Research (AFOSR).

CROSS-REFERENCE TO RELATED APPLICATIONS

This application claims benefit of U.S. provisional application No. 61/265,844 "System for controlling and calibrating single photon counting devices" filed Dec. 2, 2009.

FIELD OF THE INVENTION

The present invention relates to measuring single photons using a photon detection system. In particular it pertains to controlling and calibrating the single photon detectors for reliable and monitored performance at high rates.

BACKGROUND

Single photon counting is useful for many applications, including the measurement of quantum states in tomography or in quantum key distribution systems, as well as in a wide variety of other applications including light-based ranging. Avalanche photodiodes (APDs) are attractive since they are inexpensive, small, and convenient to use. In order to detect single photons thereby acting as a single photon detector (SPD), the bias voltage of an APD is typically brought above the breakdown level, at which point a single photon can set off a macroscopically detectable breakdown event. This is the Geiger mode of operation. Often the bias voltage is time-gated above the breakdown only when optical pulses arrive in order to get acceptable performance (D. S. Bethune et al., "System for gated detection of optical pulses containing a small number of photons using an avalanche photodiode" U.S. Pat. No. 6,218,657).

Applying a time-gated voltage across the APD causes a charge to feed-through the device that makes detecting small breakdowns difficult. However, the capability to limit the size of the breakdowns is beneficial since large breakdowns correspond to large charge flows through the device, causing more trapped carriers which in turn cause an unwanted afterpulse effect where the device can break-down upon receiving a gate pulse even when no photons are present. This afterpulse effect can be controlled by waiting a suitably long time between gates to allow the carriers to disperse. However that slows down operation.

Recent work in the field has suggested that the use of either a sine wave gate or the use of differential subtraction can allow small breakdowns to be detected using suitable analog processing (N. Namekata et al., "800 MHz single-photon detection at 1550-nm using an InGaAs/InP avalanche photodiode operated with a sine wave gating," Optics Express 14, No. 21, Oct. 16, 2006 and US patent application No. 20100111305 A1 by Yuan et al.). This has allowed for much faster gating rates. These methods are fairly simple in that they effectively use analog processing techniques. This reduces their flexibility. It can be difficult to change the rate of operation when using the type of analog subtraction methods in the prior art. For instance, with sine wave gating analog filters are used to remove unwanted spectral components, and such filters have very specific operating frequencies. On the other hand, self-differencing subtraction methods use a true time delay such as a delay line. If the time delay is implemented as a fixed delay line the frequency of operation is limited to a discrete set of values, such as an integer number of pulse repetition times.

Digital sampling using an analog-to-digital converter (ADC) combined with a simple type of digital signal processing (averaging the sampled output over many gate cycles to determine the best threshold) was proposed to digitally process the APD breakdowns (US patent application No. 20090236501 by Takahashi et al.). In principle this is a more flexible method than purely analog methods, however the gate generation circuit is not specified as digital and no substantial control over the gate generation is exploited. Additionally, all the processing is performed in the digital domain after sampling the signal from the APD using an analog-to-digital converter (ADC). The breakdown from the APD is largely repetitive capacitive feed-through with a small breakdown signal. This poses a dynamic range issue for the sampler, since the feed-through signal will saturate the sampler before the breakdown signal does. Ideally, the input to the sampler should be primarily the desired breakdown signal and that breakdown signal should be of a large enough magnitude so that the sampler records it with a high signal-to-noise ratio. This typically means that the (possibly amplified) breakdown signal should consume a significant fraction of the dynamic range of the sampler. The aforementioned analog signal processing methods address this problem by greatly reducing the feed-through via analog processing. However, as previously mentioned analog processing usually carries with it certain limitations and reduced flexibility as well. Analog and digital processing methods have not been optimally combined in prior art. Moreover, prior art does not address estimating various metrics such as the dark count rate (dark count rate is the probability of detecting a photon when none is incident) or the detection efficiency and methods to optimize the operating parameters to optimize these metrics. In a real system these metrics are important and to some degree require a trade-off where improving one will likely degrade another.

It is also noted that often times multiple SPDs are used in one system, where the output of the multiple SPDs can each be analyzed individually or together such as when measuring coincidence counting statistics, for example when performing a quantum state tomography measurement. In such cases it is desirable to design the system as a whole so as to maximize shared resources and minimize the number of expensive components or limit the number of traces interconnecting the various electronics thereby saving printed circuit board space. APD's can also be operated in linear mode, where their output voltage is linearly related to the optical intensity. In this case the bias voltage to the APD is below the breakdown level. Control over an APD bias such as to optimize its gain in linear mode has been described by Anderson in U.S. Pat. No. 5,929,982. In that work an ADC is used to look at the detector noise with no light incident on the APD and adjust the bias to a desired noise level. This technique is used for gain control when the APD is operated in linear mode so as to address dynamic range issues and issues associated with parameter variations and temperature fluctuations of the uncooled device, as opposed to Geiger mode for detecting single photons where the gain is undefined and the devices are almost always temperature controlled. Additionally, controlling the APD in linear mode is much simpler because effects such as afterpulsing are not present and the APD bias is simply a DC bias level, and therefore issues associated with the shape, magnitude, and phase of the gate pulse, as well gate feedthrough, are absent.

What is needed is a system of digital control of the SPD such that analog processing can also be implemented and optimized appropriately, preferably over a wide range of operating conditions. Performance metrics should be automatically calculated and optimal performance automatically determined by the system with little or no manipulation by the users. It is desirable to be able to monitor performance including estimating parameters such as dark count rate, detection efficiency, and afterpulse count rate. The output of the SPD can be processed in the analog domain to remove undesired feedthrough, then sampled with a sampler. Ideally the system will require a small number (including just one) of samples per gate pulse. The system should be reprogrammable so that operation over a broad range of conditions, including a wide range of gating frequencies, is possible.

Designs which allow multiple such SPDs to be measured and controlled efficiently with the minimum number of parts and high speed inter-connections are also desired. In particular such multi-SPD systems have applications in quantum state tomography, where the ideal configuration of the SPD may change depending on the properties of the quantum state to be measured.

SUMMARY

The invention herein uses a control unit to control one or more SPDs. The optical-to-electrical portion of the SPD can be an APD. The control unit can control and optimize many parameters associated with the SPD system including the generation of gated pulses of controllable frequency, amplitude, shape, and phase to bias the APD. The control system can control the amplitude and phase of an electrical reference signal of one or more spectral frequencies which are subtracted from the APD output signal before being sampled then processed in a discriminator, such as a latched comparator, which will determine if a breakdown event occurred or not and therefore if a photon was detected or not. While various discriminators could be used, it is advantageous to use a sampler such as an analog-to-digital converter (ADC) or the closely related track-and-hold (T/H) circuit. A means to capture the sampled signal into the control unit allows the control unit to use this information to monitor and optimize the system. For instance, the quality of reference signal subtraction can be determined and the phase and magnitude of the reference signal manipulated by the control unit for optimum performance. This method can work at a wide variety of gating frequencies since analog filters of a fixed frequency and self-differencing subtraction with a fixed time delay are not needed.

It is useful if the control unit can get a good picture of the entire temporal profile of the signal from the SPD, even though the breakdown event to be measured is typically only a small fraction of the time between gates. This will be helpful, for instance, in determining the quality of the reference signal subtraction as well as the ideal sampling point to measure the breakdown signal. One way to do so would be to sample (clock) the sampler at a substantially higher rate than the gate rate but where the sample rate and the gate rate maintain a fixed relationship. For instance the sample rate can be 10 times the gate rate. However, the sampler and associated electronics may not operate at such high rates, especially if multiple SPDs are being operated by one system and where it is undesirable to have many such complex and expensive high speed samplers. In such a case the relative sampling phase of the sampler can be scanned (possibly by gating it with a clock frequency that differs from the gate frequency by a non-integer or by phase-shifting the sampling clock in incremental amounts) to trace out an equivalent time picture of the breakdown. This allows the full temporal profile of the signal generated after subtracting the reference signal from the SPD output to be monitored. The resulting digitized signal can be processed to determine how well the electrical reference signal is being subtracted. The electrical reference signal amplitude and phase can then be adjusted to optimize the quality of the subtraction. The information on the temporal profile of the SPD output signal can also be used to determine the optimal temporal sampling point (phase) of the sampler to discriminate the breakdown events during a measurement.

In general the invention can be operated in a calibration mode, where information about the system is estimated so as to optimize and characterize the performance level, and a measurement mode where the actual measurements take place. The modes can be separated in time, for instance initially or periodically entering a calibration period followed by a measurement period. In some cases the two modes can be interleaved. The use of a low rate sampling clock with a varying phase with respect to the breakdown signal arrival time (or alternatively the gate pulse arrival time at the photon detector) to the T/H circuit can occur during the calibration period, so as to trace out the temporal profile of the SPD without requiring a very high sample rate ADC.

Especially when multiple SPDs are being monitored, as may happen for instance when performing a quantum state tomographic measurement, it is helpful to use T/H circuits to sample the output of the SPDs with the T/H output being sent both to a comparator in order to threshold the breakdown signal as well as to a multiplexer. The multiplexer can select one of the multiple input signals to be sent to its output and which of the multiplexer input signals is selected is controlled by the control unit. The multiplexer input singles each represent a sampled output of one of the SPDs. The desired signal to be monitored is selected by the control unit and the corresponding output of the multiplexer is sent out to an ADC to digitize the desired signal. The ADC sends the digitized signal into the monitor unit (MU). Note that the MU may be implemented in the same electrical platform as the control unit, such as in a field programmable gate array (FPGA) or integrated circuit. The T/H circuits may be operated at a sampling frequency significantly below the gate frequency during the monitoring period so that a low rate inexpensive ADC can be used as the front end digitizer for the monitor unit. By employing a multiplexer the number of ADCs required in the system can be reduced, simplifying the system.

In addition to the detection signal processing, the control unit can also control the gating signal. For instance a digital-to-analog converter (DAC) could generate a fully programmable bias gate pulse for an APD which can be varied in shape, time duration, amplitude, phase, and repetition rate. For instance, for sinusoidal gating a programmable oscillator followed by a variable attenuator and variable phase shifter can be used to control the sinusoid's frequency, amplitude, and phase. The control unit can adjust the APD bias voltage as well as the DAC generated gate pulse profile and the detection signal processing while also estimating performance parameters in order to find an ideal operating condition. A clock signal that is synchronous to the clock of the optical input pulses is distributed to the system components as needed.

There are several competing performance parameters in single photon detection systems including dark count rate, detection efficiency, and after-pulse probability. These competing performance parameters are typically balanced to the users' best judgment by varying device and system parameters like the APD bias voltage, breakdown threshold (threshold level which separates a measured photon counting event from a dark event), APD device temperature, etc. The invention here can help automatically set such parameters or provide performance data to help the user to better set them directly. For instance, periodically some gate pulses can be intentionally offset from the known optical pulse arrival locations so that the gate pulses arrive at the APD when no light is incident. The statistics of these dark events can be built up over time to estimate the dark count rate. Various metrics can be estimated so as to choose the digital filtering parameters (if the SPD signal is digitized it could be digitally filtered), breakdown threshold voltage, APD bias level, reference signal amplitude and phase, and gate pulse profile to optimize performance. This is especially the case if a reference light source is used or the approximate incident photon rate is known so that the detection efficiency can be estimated. After-pulse rates can be estimated by comparing the average photon counting rate with the photon counting rate for those pulses immediately following a breakdown or after a designated dead-time. The gates can be placed so as to detect the optical input pulses, or intentionally temporally offset so as to not detect the optical pulses and therefore estimate the dark count rate, or offset in a manner that detects a reference light source to calibrate the detection efficiency. Alternatively, an optical switch can configure the input as the desired input to be measured, or a reference optical input for detection efficiency calibration, or no input for dark count calibration, however such a configuration will add some insertion loss due to the optical switch. If the gates are offset from the arrival of the optical pulses periodically then the dark count rate can be estimated without added optical insertion loss. If a reference optical pulse is inserted into the system and the gate is shifted so as to detect the reference pulse then the detection efficiency can be calibrated. Such a dynamic change in the gating output can be generated because of the high level of control the control unit has over the gate and/or sampling instant. For instance the gate location can be changed by using a DAC, or by changing the phase of a sine wave gate, or by other such gate temporal control means, and the sampling phase of the sampler can also be changed by the control unit It is possible for the DAC to lengthen the pulse width, including making it a continuous wave (CW) signal. Thus the gate duration can be lengthened for detecting temporally longer pulses. The system could even choose to pull the APD out of Geiger mode into linear mode if desired, for instance to increase the dynamic range of a particular measurement. The presence of the reference optical signal allows the resulting detection efficiency to be characterized easily, even if the APD performance changes over time.

In some cases one wants to collect the statistics from multiple photon counters, including perhaps joint statistics such as correlation information. The photon counting system can be modified to control two or more SPD detectors using largely the same electronics. Since one may want to vary the optical delay between the detectors, an optional delay controlled by the controller unit is used to allow for the gate pulses to each APD to be independently adjusted. Reference pulses can be sent simultaneously to both detectors, which will allow for both detection efficiency calibration of both detectors as well as a check to see that the co-incidence count rate between the two detectors behaves as expected (the reference optical inputs are uncorrelated so the probability of correlated detection should be the multiplication of the probability of detection at each detector).

One application for the use of multiple detectors is in quantum state tomography. It is desirable to minimize the measurement time in such a system, but optimal measurement time for a given accuracy will depend on the SPD characteristics and the characteristics of the input state being measured. An initial measurement of the optical input state can be made which the control unit can use to estimate the properties of the input optical signal. The control unit can use this information to update the SPD parameters so as to more optimally measure the input state, allowing for faster and/or more accurate tomographies.

BRIEF DESCRIPTION OF DRAWINGS

FIG. 2 (left) shows the amplified APD output on an oscilloscope with a sine wave gate while (right) shows the amplified APD output with a sine wave gate after electrical reference signal subtraction. The relative size of the breakdown signal, which is visible as the portion of the signal that has a large variance, with respect to the total signal including feed-through increases when using electrical reference signal subtraction.

DETAILED DESCRIPTION

In the following description, for purposes of explanation, numerous specific details are set forth in order to provide a thorough understanding of the invention. It will be apparent, however, to one skilled in the art that the invention can be practiced without these specific details.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments. In general, features described in one embodiment might be suitable for use in other embodiments as would be apparent to those skilled in the art.

Figure 1:
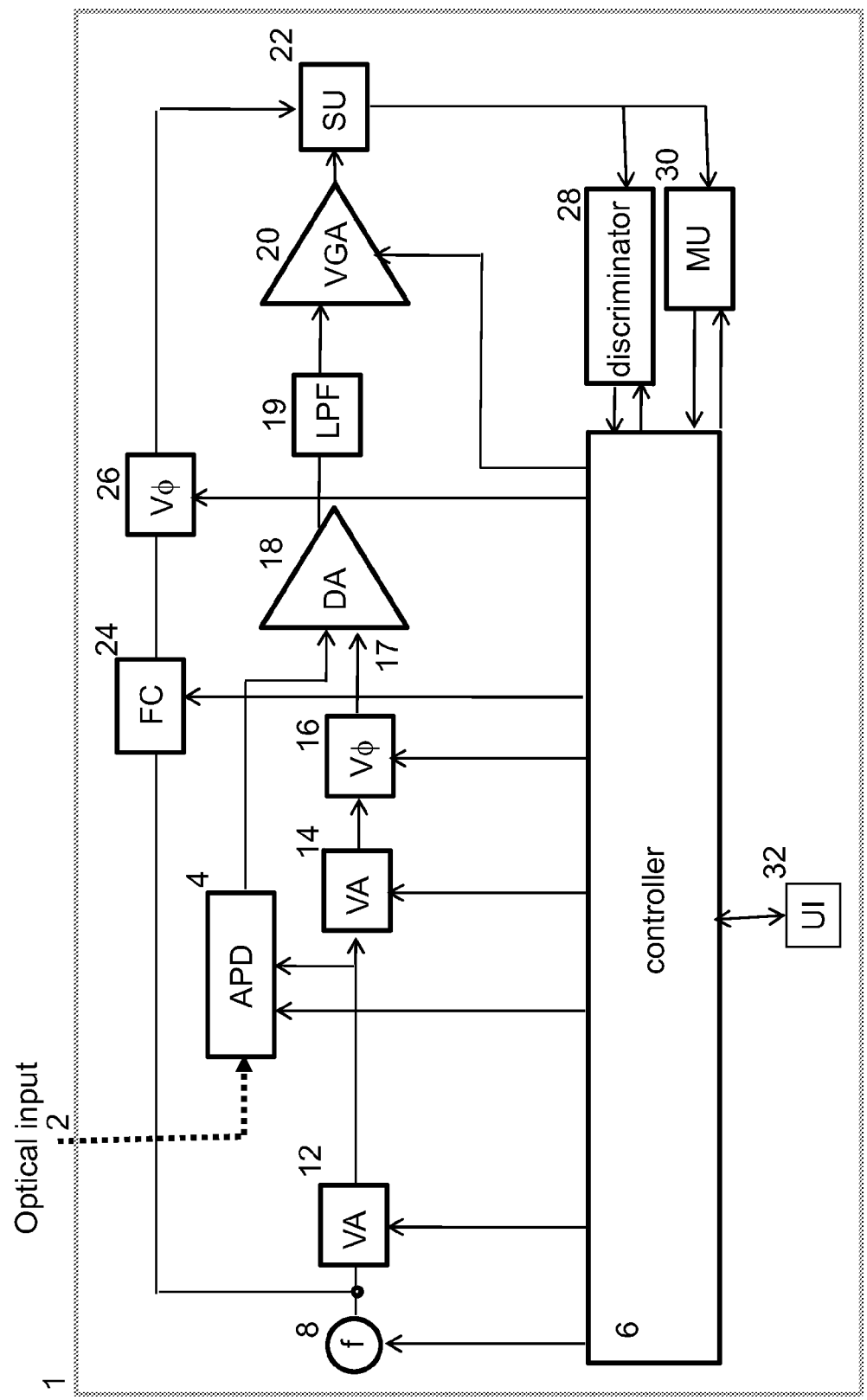
FIG. 1 is a functional block diagram for the digitally controlled photon counting circuit.

FIG. 1 is a block diagram of a preferred embodiment of an SPD system 1. An optical input signal 2, which is typically a pulsed signal, is sent to a photon detector 4 realized by an APD. A control unit 6 can apply a bias voltage to the APD 4 such that it is slightly below the breakdown voltage. A gate pulse generator 8, realized by a programmable oscillator whose frequency is selectable by the controller unit 8 and typically locked to the frequency of the input optical pulse sequence, supplies an additional gate bias that brings the APD bias above the breakdown level temporarily. The size of the gate voltage is controlled by the controller unit 6 via a variable attenuator (VA) 12, although it could be controlled by other means such as a variable gain amplifier. The gate pulse generator generates a sine wave at a frequency f. The gate frequency can be controlled by the controller unit over a wide continuous range such as 0.6-1.6 GHz. Other frequency ranges, including higher frequencies such as 3 GHz, are also possible. The controller unit can be implemented in standard electronic circuitry such as a field programmable gate array (FPGA), or an application specific integrated circuit, or a microcontroller combined with any necessary additional functions such as for example a digital-to-analog converter to generate the APD bias voltage. A portion of the frequency f is sent to act as an electrical reference signal which is controlled in magnitude and phase using a second VA 14 and reference-phase variable phase shifter (V$\phi$) 16. We note that since f is a single frequency, the phase shifter does not need to be a true-time delay but only a phase delay which is easier to realize in practice. The amplitude and phase controlled electrical reference signal 17 is sent to one input of a subtraction element 18, with the other input to the subtraction element being the output of the photon detector 4. The subtraction element 18 can be a differential amplifier. The resulting electrical reference signal subtracted signal out of the subtraction element 18 is optionally sent through a low pass filter (LPF) 19 to cut off unneeded harmonic frequencies before being amplified in a variable gain amplifier (VGA) 20, whose gain is set by the controller. For instance, the LPF could have a 1.7 GHz cutoff thereby cutting off harmonic frequencies above the third harmonic for all the frequencies in the 0.6-1.6 GHz range, but passing all the fundamental frequency. The gain of the VGA 20 is typically set so that the size of the output signal out of the VGA 20 roughly matches the dynamic range of the input to the sampling unit 22.

A sampling unit (SU) 22 which could be realized as a track-and-hold (T/H) circuit samples the output of the VGA 20. In some cases the SU could be a simple comparator outputting a single output bit which represents a one or zero depending on if the input signal is greater than or less than a threshold level at the sampling time, or it could be a T/H circuit outputting an analog signal proportional to its input signal at the sampling time, or it could be an ADC with a digital output proportional to its input at the sampling time. In this embodiment we will assume the SU 22 is realized by a T/H circuit. The sampling frequency to the SU is adjusted in a frequency controller (FC) 24 under the control of the controller unit 6. The FC 24 may keep the SU sampling frequency equal to the gate frequency, or divide it down or multiply it up depending on the desired configuration. The phase of the sampling instant is adjusted using a sample-phase V$\phi$ 26.

The output of the SU is sent to a discriminator 28 which determines if the signal represents a breakdown or not and therefore if a photon was present at the optical input or not of a particular gate pulse. The discriminator output is connected to the controller. The discriminator may be formed by sending the T/H output into a comparator, where the comparison voltage signal is set by the controller and the discriminator thus determines if the comparator input signal is less than or greater than the comparison voltage signal. If the SU is an ADC then the discriminator could be formed by a circuit that accepts the digital output of the ADC, digitally filters the ADC output, compares the filtered ADC signal to a threshold value set by the controller, and discriminates between the filtered ADC signal being greater or less than the threshold value to determine if a breakdown occurred or not. If the SU is a comparator with a single output bit, it can simultaneously perform the discrimination function as well. The preferred embodiment is to use a T/H circuit as the SU which is capable of sampling at rates up to or beyond the maximum gate frequency $f_{max}$, but also capable of sampling with a high input bandwidth (small sampling aperture) at much lower sampling rates. For instance, a Hittite HMC660LC4B T/H circuit which has a front end bandwidth of 4.5 GHz and is capable of sampling up to 3 Gs/s and down to 0.2 Gs/s could be used. In such a case the discriminator can be a high speed latched (clocked) comparator.

The output of the SU is also sent to a monitor unit (MU) 30. The MU monitors the output of the APD 4 as recorded by the SU 22 a function of time after the output signal has been processed by subtracting the electrical reference signal. When the SU is a T/H circuit the MU can be realized by a monitor ADC and associated digital processing capability to analyze the resulting digitized signal. The temporal samples of the MU 30 are used to evaluate the quality of the signal. For instance, the MU 30 can look at a series of samples of the processed APD signal where samples are offset from each other in time with respect to the arrival time of the breakdown signal (gate pulses) thereby effectively forming a time series of samples, Fourier transform the time series, and return to the controller information about the spectral tones of the signal. The controller can then adjust the electrical reference signal VA 14 and V$\phi$ 16 accordingly to minimize the leakage of such spectral tones. The MU 30 can also determine the optimal sampling phase for measuring breakdown events. In some cases the discriminator and monitor unit may be implemented in the same electronics, but are separated here for clarity.

When the SU is a T/H the monitor unit can interface to the SU via an ADC. The purpose of using a T/H as the SU followed by a monitor ADC as the front-end of the MU instead of simply using an ADC directly as the SU (the samples from this ADC could then be used in both the discriminator and the MU) is to reduce the number of high speed interconnects and high seed components. The T/H has only a single high speed output while the ADC typically has several. The SU must be capable of sampling at high rates up to $f_{max}$, such as 1.6 GHz, and reducing the number of high speed interconnects can simplify the system. An ADC could directly sample at such high rates and thus function as the SU directly, feeding the resulting already digitized signal into the MU. However, it can be advantageous to first sample with the T/H, then send that sample to be digitized in a monitor ADC inside the MU. In such a case, the monitor ADC inside the MU can potentially be a low speed ADC that samples when the T/H is being sampled at a relatively low frequency. For instance, the ADC may function at 200 MHz, which is 8× slower than a 1.6 GHz gate rate. The T/H function at the SU will also be sampled at a low rate of ~200 MHz. The temporal profile of the signal into the SU can still be discerned even if it is sampled at frequencies substantially less than f by sweeping the relative sampling phase to the SU, for instance by using the sample-phase variable phase shifter 26, with respect to the location of the gate pulses. This arrangement reduces the number of high speed pins required to interconnect the components since the monitor ADC has n output signals at the sample rate, where n~{6-12} is typical, while the comparator has only one. Since the monitor ADC is operating at a much lower rate an ADC with a serial output can be used, for instance requiring just one 1.6 Gb/s line to transfer 8 digitized bits per 200 MHz sample. If instead the ADC was operating directly at the 1.6 GHz gate rate it might be more common for the ADC to output each of the 8 bits on a different high speed trace, or even to demultiplex the 8 bit into 32 bits at 400 Mb/s thereby consuming 32 lower-speed traces. By reducing the number of traces costs can be saved on components or printed circuit board costs, especially when multiple SPDs are used as will be described later, and the size of the system can be reduced. This design makes use of the fact that the SU must function up to $f_{max}$ during measurements, but the monitor ADC can operate at lower frequencies during the time period where it is only monitoring the output waveforms.

The discriminator 28 should be able to operate at sampling speeds as fast as the fastest gate frequency since it is involved in photon counting, but the MU 30 can operate at much lower sampling rates since the MU can optionally be active only during a calibration period and not active during the measurement period. During the calibration period, the control unit 6 monitors and optimizes various parameters and uses the MU 30 and possibly also the results from the discriminator 28 in that monitoring process. For instance, the ideal sampling location of the SU 22 to sample the breakdown event during the measurement period may be found by subtracting the feed-through measured when the bias voltage is set at a low value such that even with the gate pulse the APD is just under the breakdown voltage from the signal measured with a bias voltage set so that the gate pulse brings the APD above the breakdown voltage and recording the resulting histogram. This measurement can be made for various sample locations to the SU, where the results of many pulse measurements are combined at each sample location. The optimal sampling time can be determined using this information, for instant the sampling time instant that has the most signal variation likely corresponds to the best sampling phase for measurement of the breakdown events.

The results of any measurements can be displayed to the user via a user interface 32 which may be run on a personal computer. The user interface 32 also allows the user to control the functions of the controller if desired.

FIG. 2 shows the amplified output of an APD gated at 625 MHz with a sinusoidal gate without and with electrical reference signal subtraction as recorded by an oscilloscope. The breakdown is visible in the regions where there is high variance in the output signal as the occasional breakdowns cause a noisy voltage change in the breakdown region. Without the electrical reference signal the range of the breakdown voltage with respect to the range of the total signal is small, but it gets much larger with electrical reference signal subtraction. The larger relative size of the breakdown signal is beneficial for measuring the breakdowns with a high signal-to-noise ratio in a sampling circuit.

Figure 3:
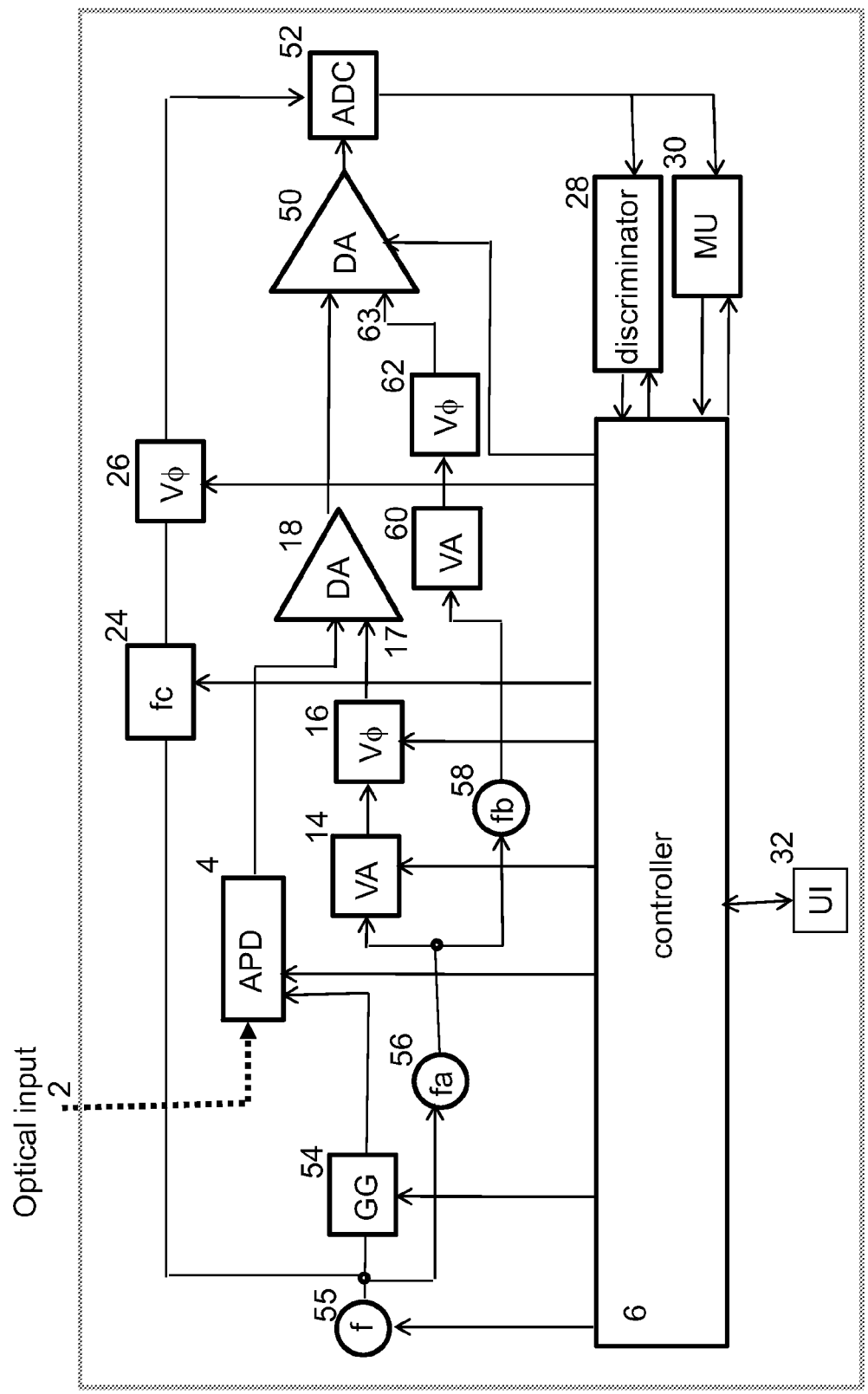
FIG. 3 is a functional block diagram for a digitally controlled photon counting circuit using a gate generator (GG) that has two reference frequencies, and uses an ADC to sample the processed breakdown signal.

FIG. 3 shows a system which uses a gate generator (GG) 54 to generate the APD gate pulse. Many components of FIG. 3 perform the same functions as those of FIG. 2 and thus may share the same numbering system. The GG could be realized using a digital-to-analog controller (DAC) clocked using a master oscillator 55 controlled by the control unit 6 and typically locked to the optical input pulse repetition rate. A DAC acting as the GG can output a waveform chosen by the controller. For instance if the chosen waveform is composed of 8 samples, then the maser oscillator will be at a frequency eight times the repetition frequency of the gate pulse. Alternatively the gate generator could be a triggered pulse generator or other means of generating controlled electrical pulses at specific repetition frequencies. Two different frequencies for electrical reference signal subtraction are derived from the master oscillator 55, or otherwise derived so they are locked to the gate frequency. One such frequency is at the gate repetition rate and is generated in a first frequency generator 56 and another such frequency is at twice the gate repetition rate and is generated in a second frequency generator 58 locked to the output of the first frequency generator 56. The signal from the first frequency generator 56 is adjusted in amplitude and phase using a first variable attenuator 14 and variable phase shifter 16, forming the first electrical reference frequency 17 that is subtracted from the photon detector 4 output in a first differential amplifier 18. The signal from the second frequency generator 58 is adjusted in amplitude and phase using a second variable attenuator 60 and variable phase shifter 62, forming a second electrical reference frequency 63 which is subtracted from the output of the first differential amplifier in a second differential amplifier 50. The use of two or more reference signals allows more complex feedthrough signals to be subtracted. In this case two DAs are used as subtraction components, one for each reference frequency, although alternatively the two electrical reference frequencies could be combined in an electrical combiner and the resulting signal subtracted from the APD output signal using a single DA or using a hybrid combiner or other type of subtraction component.

The entire system, including the gate generator 54 and subsequent signal processing, can be optimized by the control unit 6. The control unit 6 controls the value of the APD bias, the gate pulse shape generated in the DAC acting as the gate generator 54, the reference signal amplitudes and phases, and the parameters for filtering and thresholding the breakdown signal in the discriminator. Filtering could be digital filtering using the sample data and thresholding is the exact level that determines if a measured signal should be characterized as a one or a zero (photon or no-photon detected). The DAC generates a programmable gate pulse for an APD which can be varied in shape, time duration, amplitude, and repetition rate. The user interface (UI) displays the results of the photon counting and allows the user to change or monitor the various parameters.

The control unit can monitor the probability a photon is detected by comparing the number of gates which have recorded a photon (based on the discriminator threshold) to the total number of gates. In some applications such as optical ranging the power hitting the photon detector may vary by a large amount. The photon detector saturates when the percentage of gates detecting a photon becomes large, since the total percentage can never exceed 100%. Saturating the photon output is typically undesirable as it leads to nonlinear operation. Saturation can be mitigated by adjusting the bias voltage, discrimination threshold, or both so as to reduce the detection efficiency. Especially in cases where the gate generator is based off a DAC, the gate pulse shape can also be changed to increase or decrease the detection efficiency. In extreme cases where the optical photon arrival rate becomes too high to efficiently detect them in Geiger mode, the control unit may even reduce the bias voltage so that the APD is not biased above breakdown, thereby operating it in the linear mode (as opposed to the Geiger mode), or alternatively reduce the gate magnitude to a level small enough to keep the operation in linear mode. This can allow the photon detector to maintain a high detection efficiency and respond linearly to the optical intensity when the photon arrival rate becomes very high.

Figure 4:
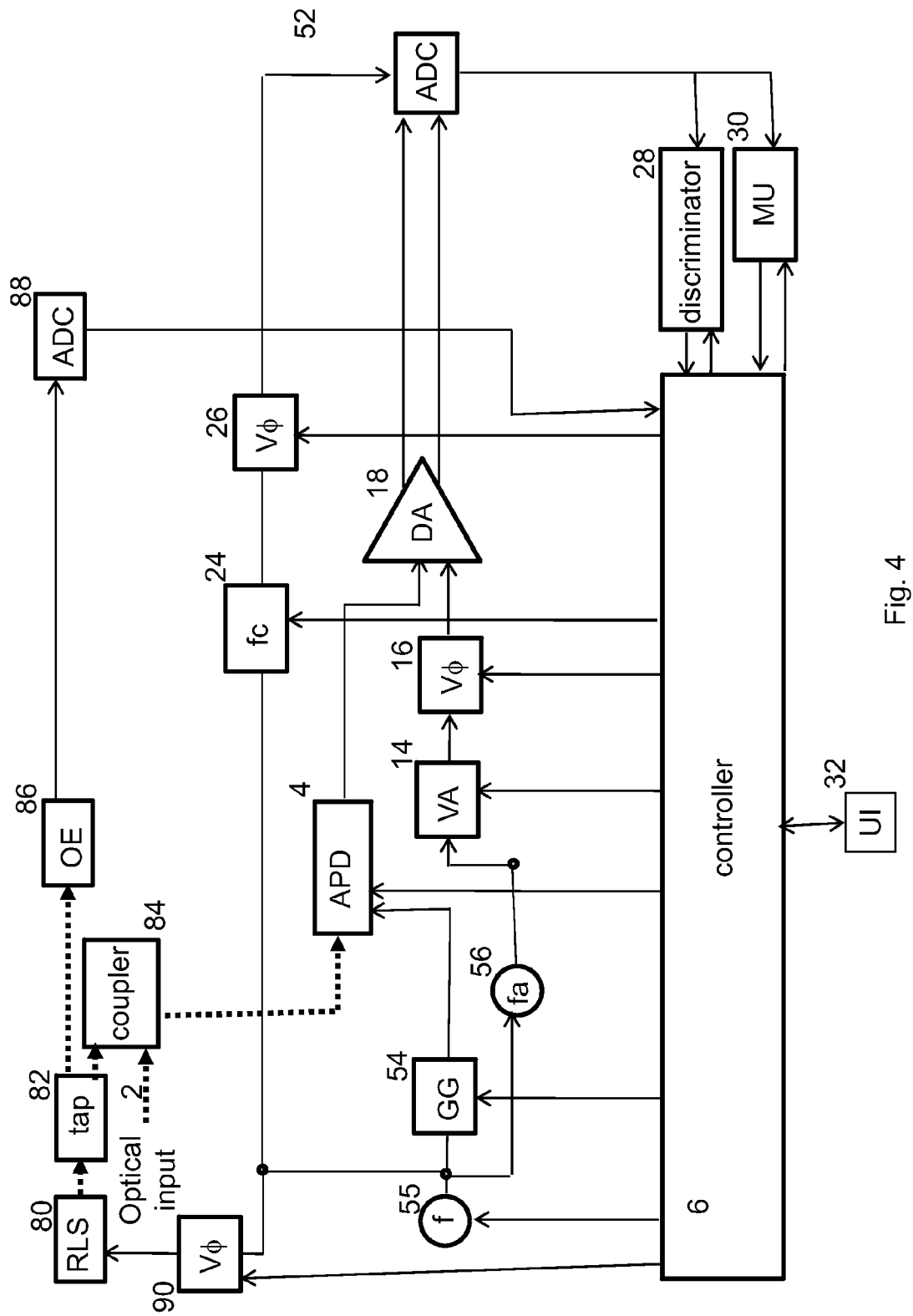
FIG. 4 is a modified digitally controlled photon counting circuit with an integrated light source for calibrating the detection efficiency.

FIG. 4 shows a modified embodiment of a SPD system that includes a reference light source (RLS) 80, a portion of which is tapped off in an optical tap 82 and combined with the optical input signal 2 to be measured in an optical coupler 84. The coupler is preferably asymmetric, for instance a 99/1 coupler such that 99% of the optical input passes through while just 1% of the RLS passes though. This allows the optical input to pass with very low loss. The other portion of the tapped RLS signal goes to an optical-to-electrical (O/E) detector 86 connected to a reference ADC 88 so that the optical power of the RLS can be calibrated. The RLS 80 can be pulsed at the same rate as the gate repetition rate, although other rates including continuous wave (CW) operation are also possible as will be described. The RLS pulse rate can be locked to the gate rate by feeding the RLS the master oscillator frequency, or some other frequency locked to the optical input pulse rate such as the first electrical reference frequency, into the RLS as a clock. The RLS clock frequency is phase shifted using a V$\phi$ 90 under the control of the control unit 6 so that the RLS optical pulses can be temporally shifted, including temporally offset from the location of the optical input pulses. The gate pulses can be configured to overlap with the RLS pulses so as to calibrate the detection efficiency, or temporally offset from the optical input pulses with the RLS turned off to estimate the dark count rate, or temporally overlapped with the optical input pulses when the RLS is turned off to perform measurements of the input optical signal. The gate pulses are offset from the arrival of the optical input pulses during a calibration period where for the purposes of dark count estimation the gate pulses are shifted in time so as not to coincide with the arrival of the input optical pulses and thus the optical input pulses are not detected since the gates do not overlap in time with the optical pulses. Alternatively the calibration could be performed on a continuous time basis by periodically shifting a fraction of the gate pulses in time (phase).

Figure 5:
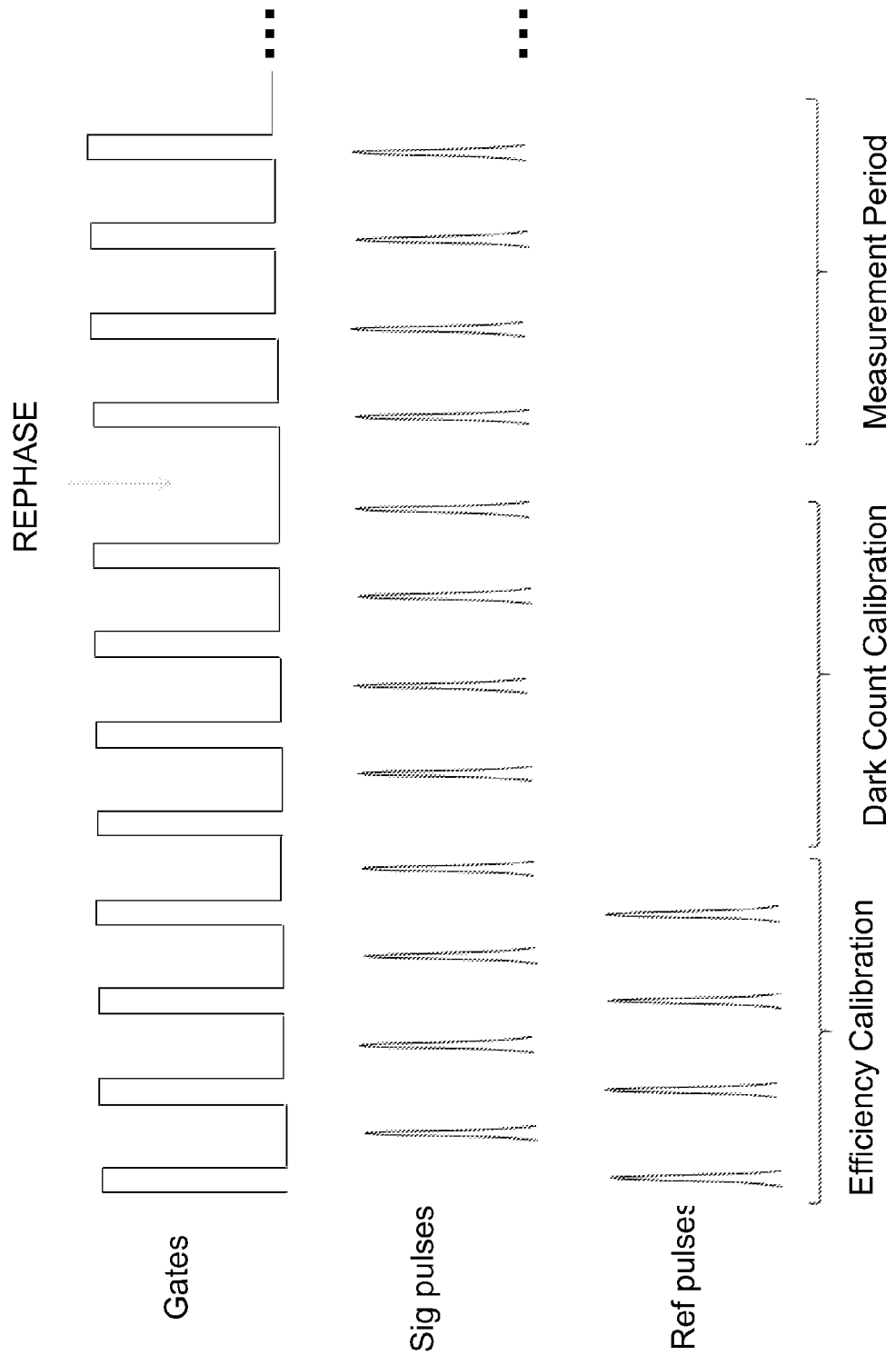
FIG. 5 shows the timing diagram of the gates, signal pulses, and reference pulses during a time period used for calibrating the detection efficiency, calibrating the dark count rate, and making a measurement of the input optical signal.

We note that for a brief time interval immediately after shifting the gate pulses the electrical reference signal subtraction may not work as well since the spectral characteristics of the gate signals will have changed. However, a waiting time can be implemented to allow the system to settle to near steady-state condition after which data can be collected as usual. A diagram depicting of the pulse and gate timing from such a system is shown in FIG. 5. During the efficiency calibration the gates overlap with the optical reference pulses at the photon detector, during the dark count calibration the gates are kept in the same location but the optical reference pulses are turned off, then the phase of the gate is changed so that they overlap with the signal pulses during the measurement period. Note that since the reference signal is derived from the same clock (in this embodiment the master oscillator 55) as the gate generator that their phases change synchronously. It may be that a time lag is desired between the rephrasing of the gate location and the start of the measurement to allow for better subtraction of the reference frequency from the photon detector output.

If the input optical signal is left on while the reference pulses are injected into the photon detector 4, then any influence of the input optical signal on the optical reference pulse measurement, which should be small since the gate is not overlapped with the input optical signal, can be subtracted out by measuring the number of background counts with the RLS turned off. The RLS can also be configured to be of various magnitudes, such as 0.1 photons per pulse and 0.01 photons per pulse. Using multiple power levels can aid in making accurate measurements of the detection efficiency. Higher numbers of photons per pulse allow for faster measurements since statistics are built up quickly but if the photon detector is an APD that cannot distinguish between a single and multiple input photons then high numbers of photons per pulse, which thus can contain multiple photons in any given pulse, can also cause difficulty in calibration. The use of two or more reference power levels can aid in making accurate measurements quickly.

Certain modifications to the design can be made to account for a continuous wave RLS, however certain features may not be possible to implement in such cases. For instance the on-the-fly dark count calibration can not be performed simply by shifting the gate pulses because the RLS optical power is located at all times as opposed to being concentrated in particular time intervals. It is possible to have an electrically controllable optical switch or an optical attenuator before the photon detector so that the optical input can be strongly attenuated during the calibration phase so that it effectively contains no photons. In that case, the gate pulses do not need to be offset from the expected arrival time of the input optical pulses in order to estimate the dark count rate. Thus, it is possible to perform this type of dark count calibration even with a continuous wave optical input. However, if an attenuator or switch is used then some additional insertion loss due to the additional optical component would be incurred as well as likely some additional component costs. Offsetting the gate pulses thus allows for a quick and easy estimation of the dark count rate without additional equipment, and thus is preferable in some cases. Additionally, when calibrating detection efficiency with a CW RLS and a gated photon detector the effective temporal width of the gate pulse must be precisely known. Since the effective temporal width of the gate pulse is frequency dependent accurate calibration in such cases can be difficult. This makes a pulsed RLS a preferred choice.

There are various means of controlling the temporal position of the RLS pulses with respect to the optical input. In general, the photon detection system needs to be provided with or to recover a clock that is synchronous with the input optical pulse repetition rate. The location of the optical pulses with respect to this clock can be determined by scanning the location of the gate pulses with respect to the clock reference and looking for an enhanced number of breakdowns which occurs when the gate pulses and the optical pulses are matched in time. Once the location of the optical input pulses with respect to the clock is known, then the timing of the generated reference pulses can be controlled so as to put the reference pulses in a different time slot. The correct timing of the reference pulses can then be calculated by the control unit 6, or alternatively the actual timing of the reference pulses can simply be measured directly by the control unit increasing the intensity of the reference pulses so that they are much larger than the input optical signal pulses and then re-scanning the gate delay to find the location that produces the highest count rate. Once the position of the reference and optical input pulses are known, the reference pulse location can be shifted by the control unit using the RLS phase shifter 90 to place it in the desired temporal location well outside of the optical input temporal location. Alternatively, a scan of the sampling phase can be performed with the RLS off to measure a background level, then with the RLS on. By subtracting the background level from the measurement with the RLS pulses on, the reference pulse location can be determined since the effect of the input optical pulses is subtracted. The appropriate adjustment of the reference pulse intensity and repetition rate is controlled by the control unit. The RLS ideally can output a signal with similar temporal features as the incoming light signal to be detected. If the pulsed light signal to be detected is substantially shorter than the optical detection window of the photon detector caused by the gate pulse, then the reference signal also should be shorter than the gate. In such as case the exact temporal width is not particularly important as long as both the reference and actual signal are short relative to the optical detection window defined by the gate. If the actual signal is not shorter than the detection window then the reference light source should ideally output a light pulse with a similar width as the input optical pulse. Alternatively, the reference pulse can be substantially longer than the gate width but then the calibration procedure will have to take into account the exact shape of the gate pulse in calculating the detection efficiency.

The system can scan various parameters such as the threshold voltage and APD bias voltage and determine the resulting effect on various metrics. The dark count rate and relative detection efficiency can be estimated as such parameters are varied in order to provide the user with information as to the tradeoffs, allowing the user to make a more informed decision as to the best settings. The detection efficiency can be well estimated if the photon flux rate of the optical input is well known, either from calibrating the optical input itself or a well calibrated RLS. As an example of parameter control the user could specify some constraints such as a particular maximum dark count level. The system could vary parameters to maintain that given dark count level within a specified range and plot the resulting detection efficiency, say as a function of after-pulse probability, on the UI 32. In this way the parameter tradeoffs can be understood by the user. If required ranges of all parameters are input by the user as well as the relative importance of improving each parameter, then the system could search for an optimal setting point. In any event, during typical use of the SPD, it is helpful to continually or periodically the monitor dark count rate so the user can factor it into the interpretation of the data and be alarmed to unexpected changes. If desired, parameters such as the threshold can be continually adjusted to maintain a given metric such as a fixed dark count level. If a reference light signal is used, the detection efficiency can be monitored and controlled in a similar way.

Alternatively, if continual in process monitoring is not required, an optical switch can be inserted before the APD to select either the actual input signal, the reference signal, or no optical signal in order to perform the desired measurement, estimate detection efficiency, or estimate dark counts, respectively. The optical switch can be controlled by the control unit so that the various measurements can be performed quickly with minimal disruption. The dark count and detection efficiency estimates can be performed upon request of the user, at regular intervals, or upon a defined alarm such as an unexpected rise or fall in detection rate, dark count rate, or after-pulse rate.

Figure 6:
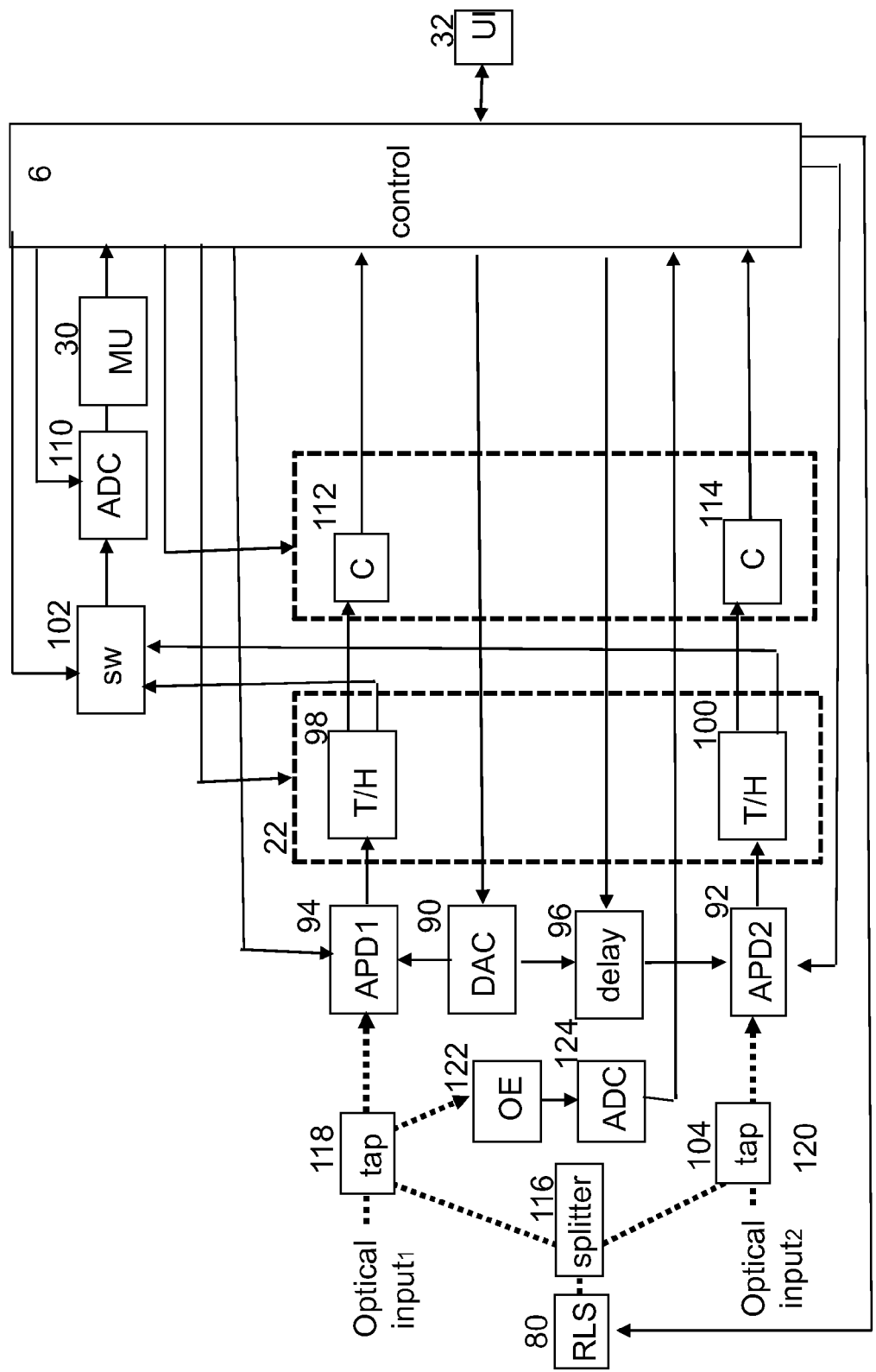
FIG. 6 depicts a more detailed implementation of the digitally controlled photon counting circuit that uses multiple APDs each of which is sampled using a T/H circuit. The T/H has two outputs, with one output from each T/H going to a multiplexer that selects one of the T/H output signals to be monitored in the monitor unit. The other T/H outputs are each sent to a discriminator realized by a comparator.

In some applications there may be multiple optical inputs. For instance, the optical signal may be split by a beam splitter into two components and the photon counting results of each component needs to be recorded separately. Or, the signal and idler photons pairs from a correlated photon source may be jointly detected. An embodiment for such applications is depicted in FIG. 6. This embodiment is similar to the SPD system of FIG. 4 except one DAC 90 is used as a gate generator to gate two APDs 92,94, where the temporal location of the gate is independently controllable to each APD due to the inclusion of a tunable delay block 96, the electrical reference signal is omitted for clarity since it is optional, a single RLS 80 is input to both APDs, and the SU 22 has two channels composed of two T/H circuits 98,100. The clocks specifying the sampling times for all the devices are assumed to be set by the control unit, though for simplicity these clock connections are not shown in this figure. The MU 30 samples are formed by selecting which T/H to observe using a multiplexer 102 controlled by the control unit 6, with the output of the switch connected to a monitor ADC 110, which could also be considered an integral part of the MU 30 but is separated in the diagram for clarity. The MU ADC 110 operates at lower sampling rates than the gate repetition rate. The discriminator is formed by thresholding the T/H outputs in their respective comparators 112,114. The design has much less stringent requirements on the speed and number of ADCs than if ADCs were used to sample the APD outputs directly. A single RLS 80 is split into two parts by a RLS optical splitter 116, which one of the resulting outputs being combined with a first optical input in a first tap coupler 118 and the other output being combined with a second optical input in a second tap coupler 120. The first tap coupler 118 has two outputs, one of which is sent to an OE converter 122 and a reference ADC 124 to calibrate the power of the RLS. Both tap couplers 118,120 feed the resulting optical signal into their respective photon detectors 92,94.

The ability of the SPD system to adjust the SPD performance characteristics via the control unit can be used in many applications. As an example the required amount of time to record a complete quantum tomographic measurement depends on the required accuracy of the measurement, the properties of the source being measured, and the properties of the SPDs. A system can initially measure the source characteristics using default SPD parameters in order to get an estimate of the source's parameters including the probability of a photon being emitted per gate. Using this measurement, the SPD parameters can be chosen to optimize the measurement time for a given accuracy. For instance, if the probability of detecting a photon in a gate is quite low then the optimal measurement may reduce dark count probability at the expense of detection efficiency while if the probability of detecting a photon is higher then the optimal measurement may increase dark count probability to also increase the detection efficiency. In one embodiment, a plurality of detector settings with known performance characteristics are saved in a memory and the control unit uses this information combined with the initial measurement of the optical input state to choose which one of the settings will give the fastest measurement with the source under consideration given the performance requirements. The estimate can be based off basic parameters such as the probability of a photon being detected and level of correlations detected. For a given estimated detection efficiency, this corresponds to the probability of a photon being emitted or the probability of a correlated pair of photons being emitted. A one-time analysis of expected performance from typical sources such as entangled photon sources can be made to form a table of correspondence between the measured parameters and the desired SPD settings. Alternatively, a more sophisticated theoretical analysis can be conducted or any of a number of search methods such as a genetic algorithm can be applied where the measurement results are compared when using different settings to find the optimal settings. The SPD parameters including gate frequency, gate width, gate magnitude, gate phase, bias voltage, threshold, and dead-time can be varied for the purposes of improving overall performance, thereby changing such metrics as detection efficiency, dark count rate, and afterpulse rate.

Typically the dead time for which the output of the detector is ignored is set to a specified unit of time. Alternatively, the multi-detector system can be configured so that if either detector registers a detection event both the detectors are ignored until a gate occurs where both the detectors have registered a designated number of continuous non-detection events. A counter keeps track of the number of valid gates that are not ignored so that the number of valid gates can be accurately determined, so as to define the statistics including the probability of a single photon count per gate properly. This method is effectively a variable dead-time based on the actual count statistics of the two (or possibly more) detectors.

Foregoing described embodiments of the invention are provided as illustrations and descriptions. They are not intended to limit the invention to precise form described. In particular, it is contemplated that functional implementation of invention described herein may be implemented equivalently in hardware, software, firmware, and/or other available functional components or building blocks. Other variations and embodiments are possible in light of above teachings, and it is thus intended that the scope of invention not be limited by this.

What is claimed is:

1. An apparatus for detecting light at a single photon level, comprising: a photon detector to detect single photons that enter through an optical input; a gate pulse generator for generating gate pulses to arm the detector to detect photons at temporal locations determined by the gate pulse; a reference electrical signal composed of one or more of fundamental and harmonic spectral frequencies that comprise the gate pulses over a given time interval; a phase adjusting element on each fundamental and harmonic reference spectral frequency; at least one subtraction component that subtracts a phase controlled reference signal from an output of the photon detector; and a control unit which controls the phase adjusting elements of the reference signal in order to reduce unwanted periodic feed through out of the detector.

2. The apparatus according to claim 1, further comprising: an amplitude adjusting element on each fundamental and harmonic reference spectral frequency; at least one subtraction component subtracts an amplitude controlled reference signal from the output of the photon detector; and the control unit controls amplitude adjusting elements of the reference signal in order to reduce unwanted periodic feed through out of the detector.

3. The apparatus according to claim 1, wherein a gate generator output is sinusoidal in time.

4. The apparatus according to claim 3, wherein a gate generator frequency is controlled by the control unit; and the reference signal is one or more sinusoidal frequencies that are locked to the gate generator frequency.

5. The apparatus according to claim 1, further comprising: a monitor unit which can evaluate the quality of the reference signal subtraction, and where the monitor unit is connected to the control unit.

6. The apparatus of claim 5, wherein a plurality of photon detectors are integrated into a photon detection system, where the control unit is used to control the plurality of photon detectors, a discriminator for each photon detector is composed of a track-and-hold (T/H) circuit followed by a comparator, and a copy of the output of each T/H circuit is sent to a multiplexer controlled by the control unit so that the control unit can select one of the T/H circuits to be sent to the monitor unit that can monitor any of the photon detectors.

7. The apparatus of claim 6, wherein outputs of photon detectors are ignored after a photon is detected until all the photon detectors do not detect a photon for a fixed number of gate pulses, and a counter keeps track of the number of gate pulses for which the photon detector outputs are valid.

8. The apparatus according to claim 5, wherein a signal from the photon detector after reference signal subtraction is sampled in a monitor analog-to-digital converter (ADC) and the samples from the monitor ADC are used in the monitor unit.

9. The apparatus according to claim 8, wherein a relative sampling phase of the monitor ADC with respect to the gate pulses can be controlled by the control unit and is intentionally changed so as to measure a temporal profile of the output of the photon detector after reference signal subtraction, a sampled output of the monitor ADC is processed in the monitor unit, and wherein the control unit can then adjust the reference signal for higher quality subtraction as determined by the monitor unit.

10. The apparatus of claim 9, further comprising: a discriminator to threshold the signal from the photon detector after the reference signal has been subtracted from it; the discriminator is formed by a T/H circuit sent to a comparator, and where the sampling phase and comparison voltage of the comparator is controlled by the control unit.

11. The apparatus of claim 10, wherein the T/H output is also sent to the monitor ADC which digitizes the T/H output for use in the monitor unit to monitor the system operating condition.

12. The apparatus of claim 11, wherein during a calibration period the T/H and subsequent monitor ADC is sampled at a rate much lower than the gate rate, but a plurality of phases of the sample times with respect to the gate pulses are used so as to measure a temporal output of the photon detector in the monitor unit.

13. The apparatus according to claim 8, wherein measurements of the optical input signal are made during a measurement period, and where a discriminator is formed by a track-and-hold (T/H) circuit connected to a high speed comparator circuit, the discriminator used to threshold the signal from the photon detector after the reference signal has been subtracted from it; the monitor unit receives the sampled detector output signal using the same T/H circuit that is also connected to the monitor ADC, and wherein during a calibration period the monitor unit monitors the output of the photon detector via the monitor ADC and the T/H circuit feeding the monitor ADC is clocked at a sample rate less than the gate pulse repetition rate and where the T/H sample phase is varied during the calibration period so as to monitor a nearly periodic detector output at a variety of sample times relative to the gate pulse arrival time, and where during the measurement period the T/H is sampled at a fixed phase at a potentially higher rate including the gate repetition rate so that the discriminator can discriminate each measured gate pulse as either containing a photon or not containing a photon.

14. The apparatus according to claim 13, wherein the monitor unit determines an optimal sampling phase for the discriminator.

15. The apparatus according to claim 1, further comprising: a discriminator to threshold the signal from the photon detector after the reference signal has been subtracted from it.

16. The apparatus according to claim 15, wherein the signal from the photon detector after reference signal subtraction is sampled in an output analog-to-digital converter (ADC) and the samples from the output ADC are used in the discriminator.

17. The apparatus of claim 1, wherein a reference light source (RLS) signal is combined with the optical input signal via an asymmetric coupler such that the loss of the optical input signal through the asymmetric coupler port that connects with the photon detector is much smaller than the loss of the RLS signal, and wherein a portion of the RLS signal is tapped off and measured with a photodetector followed by a reference ADC, wherein the output of the reference ADC is connected to the control unit so the control unit can measure the reference power level.

18. The apparatus according to claim 1, wherein the gate generator is a digital-to-analog converter (DAC) and the DAC output is controlled by the control unit.

19. The apparatus according to claim 1, wherein the output of the gate generator is controlled by the control unit and an output location of the gates are configured such that the gates do not overlap with incoming optical pulses in order to estimate a dark count rate.

20. The apparatus according to claim 19, which includes a reference light source (RLS) controlled by the control unit, wherein during a calibration period the control unit configures the RLS to generate a reference light signal and the gate generator is configured by the control unit to measure the RLS signal in order to estimate the photon detector's detection efficiency.

21. The apparatus according to claim 20, wherein a portion of the output of the RLS is tapped off and measured by a reference photodetector sampled by a reference ADC in order to measure the intensity of the RLS.

* * * * *